US 11,456,699 B1

(12) United States Patent
Bohannon et al.

(10) Patent No.: US 11,456,699 B1
(45) Date of Patent: Sep. 27, 2022

(54) CMOS OSCILLATOR BIASED WITH MIXED BIAS CURRENT

(71) Applicant: Sony Semiconductor Solutions Corporation, Kanagawa (JP)

(72) Inventors: Eric Bohannon, Henrietta, NY (US); Kevin Fronczak, Rochester, NY (US); Jason Inman, Rochester, NY (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 17/335,800

(22) Filed: Jun. 1, 2021

(51) Int. Cl.
*H03B 5/04* (2006.01)
*H03B 5/12* (2006.01)

(52) U.S. Cl.
CPC ............. *H03B 5/04* (2013.01); *H03B 5/1228* (2013.01); *H03B 5/1231* (2013.01); *H03B 2200/0062* (2013.01)

(58) Field of Classification Search
CPC ....................................................... H03B 5/04
USPC .................................................... 331/117 FE
See application file for complete search history.

(56) References Cited

U.S. PATENT DOCUMENTS

| 5,412,349 A * | 5/1995 | Young .................. H03L 7/0995 331/34 |
| 5,635,878 A * | 6/1997 | Liu ...................... H03K 3/0231 327/237 |
| 7,388,447 B1 * | 6/2008 | Potanin .................. H03K 3/011 331/185 |
| 2008/0122546 A1 * | 5/2008 | Shiramizu .............. H03M 9/00 331/34 |

* cited by examiner

*Primary Examiner* — Joseph Chang
(74) *Attorney, Agent, or Firm* — Michael Best & Friedrich LLP

(57) ABSTRACT

Oscillator circuits, electronic devices, and methods are disclosed. In one embodiment, an oscillator circuit includes a plurality of oscillator transistors comprising a plurality of gates, a plurality of adjustment transistors coupled to the plurality of gates, a differential output coupled to the plurality of oscillator transistors, a plurality of current transistors configured to receive one or more mixed bias current outputs, and generate a main current based on the one or more mixed bias current outputs, the one or more mixed bias current outputs and the main current being substantially constant over a range of temperatures, and one or more switches configured to set an oscillation frequency of the differential output by driving a first portion of a main current through at least one of the plurality of oscillator transistors, and driving a second portion of the main current through at least one of the plurality of adjustment transistors.

20 Claims, 6 Drawing Sheets

CMOS OSCILLATOR BIASED WITH MIXED BIAS CURRENT

BACKGROUND OF THE INVENTION

1. Field of the Invention

This application relates generally to electronic devices. More specifically, this application relates to electronic devices with a low temperature coefficient complementary metal-oxide-semiconductor (CMOS) oscillator biased with a mixed bias current.

2. Description of Related Art

Input devices, including proximity sensor devices (e.g., touchpads or touch sensor devices), are widely used in a variety of electronic systems. A proximity sensor device may include a sensing region, often demarked by a surface, in which the proximity sensor device determines the presence, location and/or motion of one or more input objects. Proximity sensor devices may be used to provide interfaces for the electronic system. For example, proximity sensor devices may be used as input devices for larger computing systems (e.g., opaque touchpads integrated in, or peripheral to, notebook or desktop computers). Proximity sensor devices are also often used in smaller computing systems (e.g., touch screens integrated in cellular phones). Proximity sensor devices may also be used to detect input objects (e.g., finger, styli, pens, fingerprints, etc.).

Many electronic devices, including input devices, may be expected to operate over a wide range of temperatures. Oscillators are often used to provide clock signals. However, oscillation frequency can be affected by temperature changes, thereby affecting the clock signals. Accordingly, it may be desirable for the electronic devices to include circuitry that provides a stable oscillation frequency over the wide range of temperatures.

The temperature coefficient of a CMOS oscillator (i.e., an amount of change in a frequency of the CMOS oscillator over a range of temperatures) may be reduced with additional auxiliary current sources. However, a problem occurs with the additional auxiliary current sources when there a mismatch between the current sources, which requires a per-chip calibration to minimize the temperature coefficient. This per-chip calibration requires a CMOS oscillator to have two calibrations: 1) a calibration to a target oscillating frequency, and 2) a calibration of the auxiliary current sources to reduce the temperature coefficient.

BRIEF SUMMARY OF THE INVENTION

In view of the foregoing, there is a need for CMOS oscillator that reduces or eliminates a mismatch between auxiliary current sources and does not require a calibration to reduce the temperature coefficient. The low temperature coefficient CMOS oscillator of the present disclosure reduces or eliminates the mismatch between the auxiliary current sources and does not require a calibration to reduce the temperature coefficient.

In one aspect of the present disclosure, there is provided an oscillator circuit. The oscillator circuit includes a plurality of oscillator transistors comprising a plurality of gates, a plurality of adjustment transistors coupled to the plurality of gates, a differential output coupled to the plurality of oscillator transistors, a plurality of current transistors, and one or more switches. The plurality of current transistors configured to receive one or more mixed bias current outputs, and generate a main current based on the one or more mixed bias current outputs that are received, the one or more mixed bias current outputs and the main current being substantially constant over a range of temperatures. The one or more switches configured to set an oscillation frequency of the differential output by driving a first portion of a main current through at least one of the plurality of oscillator transistors, and driving a second portion of the main current through at least one of the plurality of adjustment transistors.

In another aspect of the present disclosure, there is provided an electronic device including an oscillator circuit. The oscillator circuit includes a plurality of oscillator transistors comprising a plurality of gates, a plurality of adjustment transistors coupled to the plurality of gates, a differential output coupled to the plurality of oscillator transistors, a plurality of current transistors, and one or more switches. The plurality of current transistors configured to receive one or more mixed bias current outputs, and generate a main current based on the one or more mixed bias current outputs that are received, the one or more mixed bias current outputs and the main current being substantially constant over a range of temperatures. The one or more switches configured to set an oscillation frequency of the differential output by driving a first portion of a main current through at least one of the plurality of oscillator transistors, and driving a second portion of the main current through at least one of the plurality of adjustment transistors.

In yet another aspect of the present disclosure, there is provided a method for operating an oscillator circuit. The method includes generating a main current based on one or more mixed bias current outputs, the one or more mixed bias current outputs and the main current being substantially constant over a range of temperatures. The method also includes setting an oscillation frequency of a differential output by adjusting one or more switches to drive a first portion of the main current through at least one of a plurality of oscillator transistors and a second portion of the main current through at least one of a plurality of adjustment transistors.

In this manner, the above aspects of the present disclosure provide for improvements in at least the technical field of imaging, as well as the related technical fields of signal processing, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Figure 1:
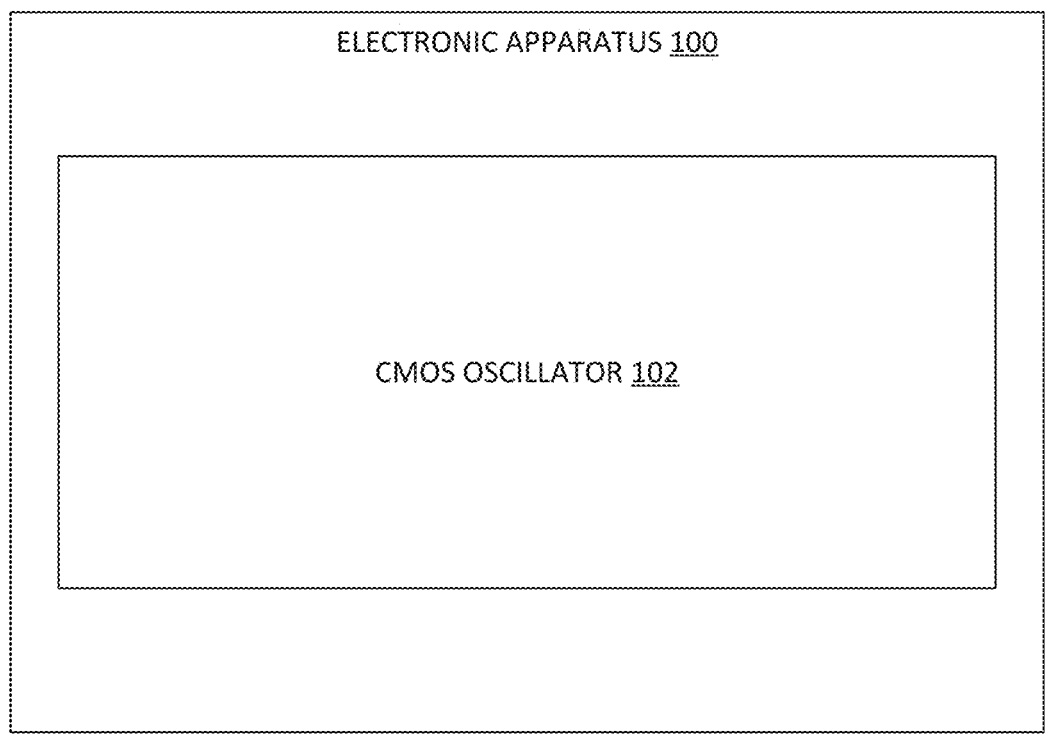
FIG. 1 is a block diagram illustrating an electronic device including an example of a CMOS oscillator that implements a mixed bias current, in accordance with various aspects of the present disclosure.

FIG. 1 is a block diagram illustrating an electronic device 100 including an example of a CMOS oscillator 102 that implements a mixed bias current, in accordance with various aspects of the present disclosure. In the example of FIG. 1, the electronic device 100 may an imaging device. However, the electronic device 100 is not limited to an imaging device, but may be any device that uses a clock signal, for example, a smartphone, a table computer, a laptop computer, or other device that uses a clock signal. In some examples, the electronic device 100 may be an application-specific integrated circuit (ASIC). In other examples, the electronic device 100 may be a phase-locked loop (PLL), a radio frequency (RF) transceiver, a display, an ultrasonic sensor, a capacitive sensor, or any other electronic device that generates transmit or drive signals. The CMOS oscillator 102 generates a periodic signal (e.g., a sine wave or a square wave) and is described in more detail below in FIGS. 2-6.

Low Temperature Coefficient

Figure 2:
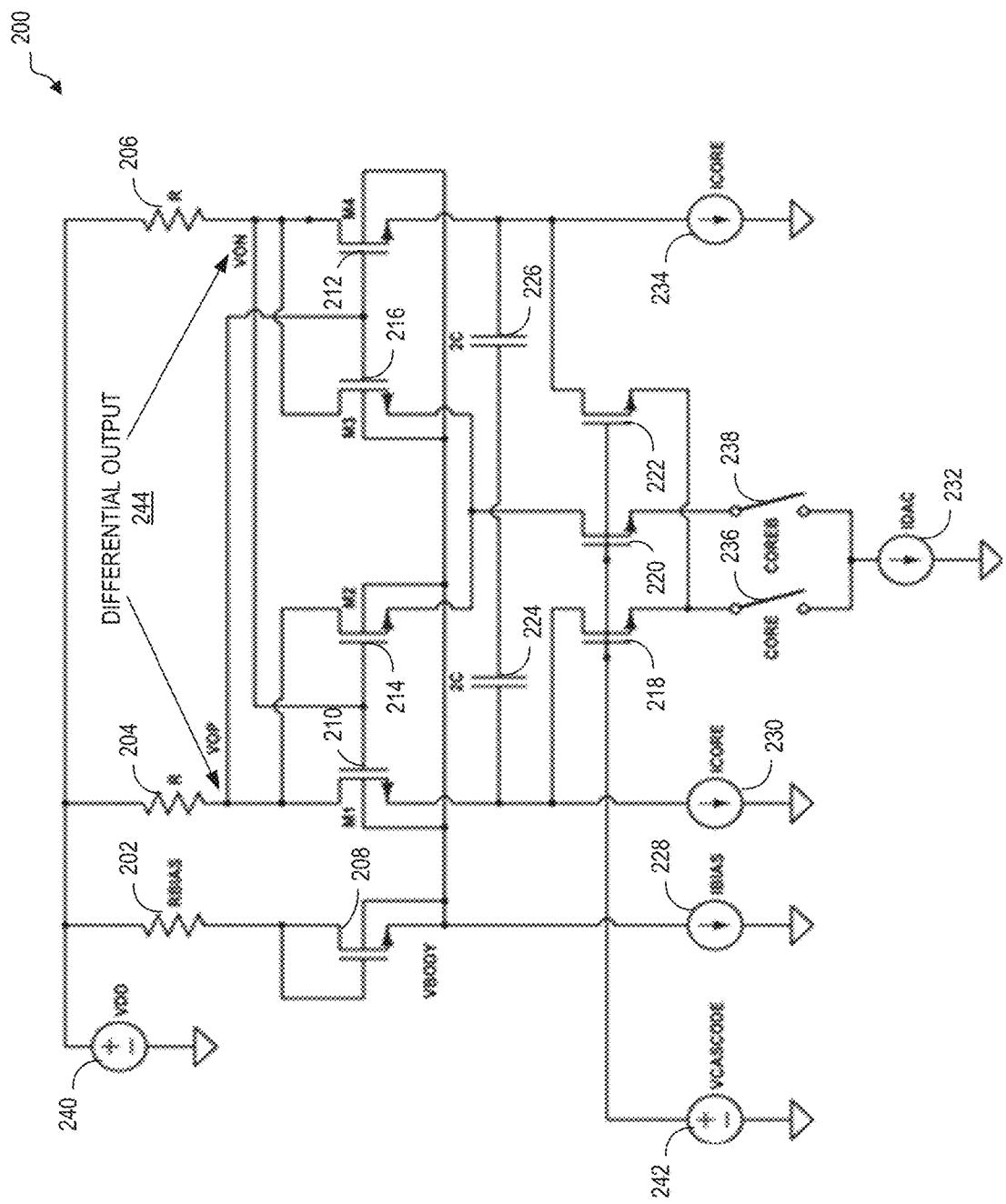
FIG. 2 is a circuit diagram illustrating an example of a CMOS oscillator that implements a mixed bias current, in accordance with various aspects of the present disclosure.

FIG. 2 is a circuit diagram illustrating an example of a CMOS oscillator 200 that implements a mixed bias current, in accordance with various aspects of the present disclosure. The CMOS oscillator 200 is one example of the CMOS oscillator 102 of FIG. 1.

Specifically, FIG. 2 illustrates the exemplary CMOS oscillator 200 including a plurality of resistors 202-206, a plurality of transistors 208-222, a plurality of capacitors 224 and 226, a plurality of current sources 228-234, a plurality of switches 236 and 238, a plurality of voltage sources 240 and 242, and a differential output 244.

The plurality of resistors 202-206 includes two resistor groupings. The first grouping is the resistor 202 (i.e., resistor $R_{BIAS}$). The second grouping is the resistors 204 and 206 that have a similar resistance. In some examples, the resistors 204 and 206 have a nearly identical resistance.

The plurality of transistors 208-222 includes four transistor groupings. The first grouping is a body transistor 208. The second grouping is a plurality of oscillator transistors 210 and 212. The third grouping is a plurality of adjustment transistors 214 and 216. The fourth grouping is a plurality of current transistors 218-222.

The plurality of current sources 228-234 includes three types of current sources. The first type is the bias current source 228 (i.e., current source $I_{BIAS}$). The second type is the core current sources 230 and 234 (i.e., current sources $I_{CORE}$ and $I_{COREB}$). The third type is the DAC current source 232 (i.e., current source $I_{DAC}$).

The plurality of voltage sources 240 and 242 includes two types of voltage sources. The first type is the supply voltage source (i.e., voltage source $V_{DD}$). The second type is a cascode bias voltage source (i.e., voltage source $V_{CASCODE}$).

The differential output 244 has an oscillation frequency that may be used as a clock signal to operate other circuitry. For example, the exemplary CMOS oscillator 200 may be located on or with display circuitry of an input device (e.g., a touchscreen or presence-sensitive display). However, the exemplary CMOS oscillator 200 may be implemented in any electronic device that uses a clock signal to operate other circuitry (see examples described with respect to FIG. 1).

As illustrated in FIG. 2, first nodes of the plurality of resistors 202-206 are each connected to the voltage source 240. A second node of the resistor 202 is connected to the drain and the gate of the body transistor 208. A second node of the resistor 204 is connected to the drain of the oscillator transistor 210, the drain of the adjustment transistor 214, the gate of the oscillator transistor 212, and the gate of the adjustment transistor 216. A second node of the resistor 206 is connected to the drain of the oscillator transistor 212, the drain of the adjustment transistor 216, the gate of the oscillator transistor 210, and the gate of the adjustment transistor 214. The second nodes of the resistors 204 and 206 also form the differential output 244.

The plurality of current transistors 218-222 and the plurality of switches 236 and 238 in combination with the current source 232 provide a main current, i.e., a DAC current. The plurality of current transistors 218-222 and the plurality of switches 236 and 238 divides the DAC current into at least two portions. A first portion of the DAC current is driven through the oscillator transistors 210 and 212 and a remaining portion of the DAC current is driven through the adjustment transistors 214 and 216.

The relative sizes between the first portion and the remaining portion of the DAC current may be adjusted by adjusting the plurality of current transistors 218-222 and the plurality of switches 236 and 238. The oscillation frequency of the differential output 244 is based on the size of the first portion of the DAC current driven through the oscillator transistors 210 and 212. Consequently, the oscillation frequency may be adjusted by adjusting the plurality of current transistors 218-222 and the plurality of switches 236 and 238 to then adjust the first portion of the DAC current.

The plurality of current transistors 218-222 are auxiliary current sources that reduce a temperature coefficient of the exemplary CMOS oscillator 200. However, the plurality of current transistors 218-222 may be subject to a mismatch and need a per-chip calibration to reduce temperature coefficient. The per-chip calibration is difficult, especially when trying to get a temperature coefficient better than 1% and requires very fine control over current levels.

To improve matching between the plurality of current transistors 218-222 (which reduces or eliminates the effects of any possible mismatch), a body voltage, VBODY, of each of the transistors 210-216 is generated by a replica circuit including the resistor 202, the body transistor 208, and the current source 228. The body transistor 208 is a diode-connected transistor with a resistive load that is biased with a scaled copy (i.e., the current $I_{BIAS}$) of the same current used to bias the transistors 210-216. In some examples, the transistors 210-216 may be common centroided when the transistors 210-216 are in the same well.

It is typically not desirable to source-body tie the transistors 210-216 because the source-body tie would typically create three separate wells, which would increase area, increase capacitance, and degrade matching. However, the configuration of the exemplary CMOS oscillator 200 (in particular, the body voltage, $V_{BODY}$ generated by the replica circuit) ensures the transistors 210-216 may be placed in the same well. Additionally, the configuration of the exemplary CMOS oscillator 200 ensures that the respective threshold voltages of the transistors 210-216 may be less than the respective threshold voltages of the transistors 210-216 had the body terminals the transistors 210-216 been tied to ground, which is preferable for low-voltage operation.

Additionally, the exemplary CMOS oscillator 200 is biased with currents that are a mixture of a PTAT bias current (proportional to absolute temperature current) and a ZTAT bias current (zero to absolute temperature current or zero temperature coefficient current). Put simply, the exemplary CMOS oscillator 200 is biased with bias currents that are a mixture of a bias current that changes with temperature (i.e., PTAT) and a bias current that does not change with and is independent of temperature (i.e., ZTAT).

A first-order analysis assumes the transistors 210-216 do not have a body effect and operate in the sub-threshold region of operation. This assumption leads to only a PTAT bias current being needed to minimize the temperature coefficient.

In view of the above assumption, the transistors 210-216 are assumed to be in what is traditionally called weak inversion, where the currents follow that of a traditional bipolar response. In this case, a PTAT bias current is the only thing needed to zero the temperature coefficient. However, in practice, the transistors 210-216 are never deep enough in weak inversion for the above assumption to be complete true. Instead, the transistors 210-216 are somewhere between moderate inversion or weaken version, and the transistors 210-216 are not deep into weak inversion where the VGS voltage is very small. Weak inversion may be quantified by large negative overdrive voltages. An overdrive voltage is the difference between VGS and VTH where VGS is the gate-to-source voltage and VTH is the threshold voltage.

With the understanding that the transistors 210-216 are not in deep weak inversion, then the PTAT bias current is not enough to reduce the temperature coefficient of the CMOS oscillator 300 to the point where the temperature coefficient is less than 1%. To address the fact that the transistors 210-216 are not in deep weak inversion, the addition of some ZTAT bias current (also referred to as "ZTC" or "flat current") with the PTAT bias current accounts for the fact that the transistors 210-216 are not in deep and weak inversion.

Figure 3:
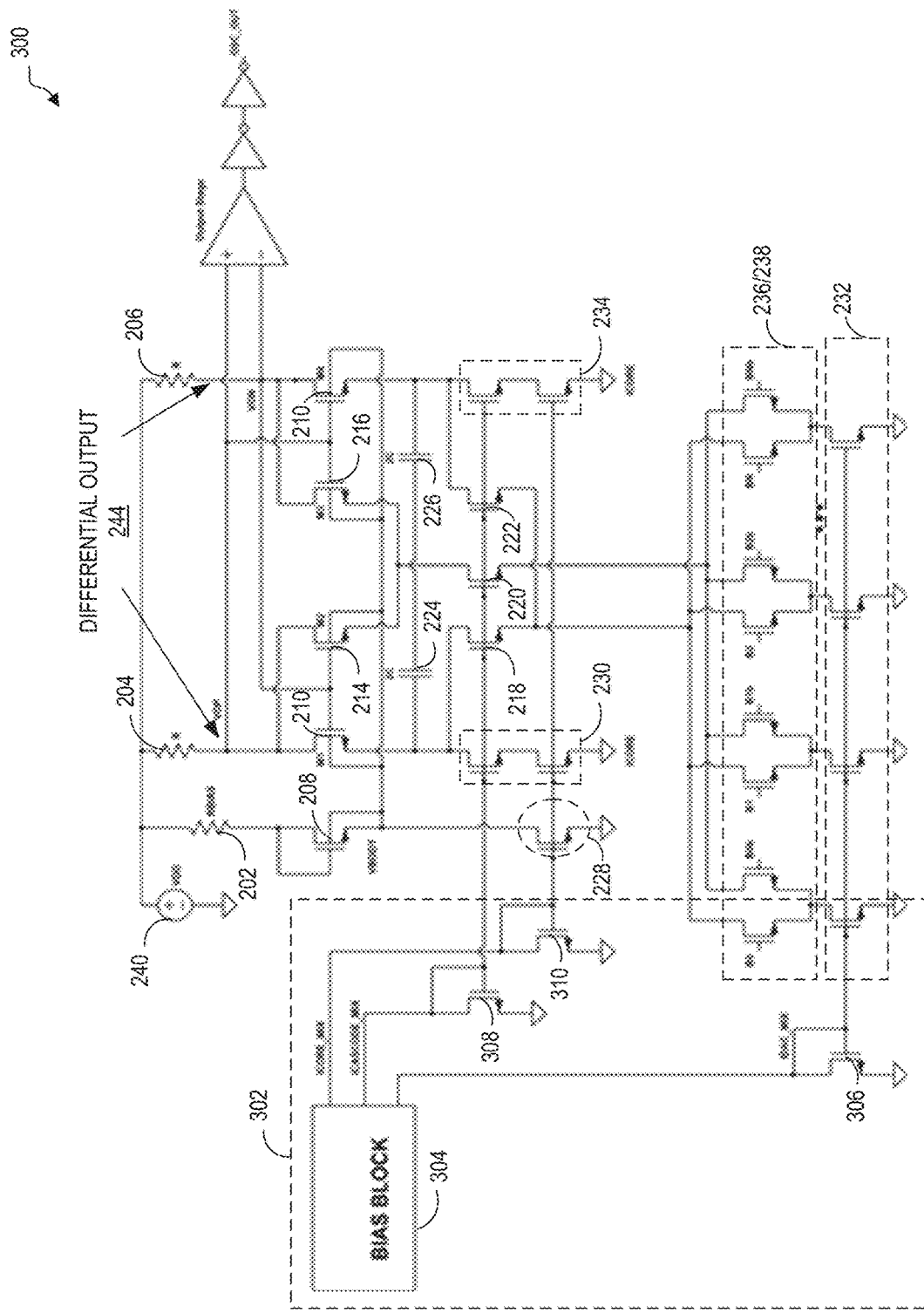
FIG. 3 is a circuit diagram illustrating an example of a CMOS oscillator that implements a mixed bias current with a bias network, in accordance with various aspects of the present disclosure.

FIG. 3 is a circuit diagram illustrating an example of a CMOS oscillator 300 that implements a mixed bias current with a bias network 302, in accordance with various aspects of the present disclosure. The oscillator circuit 300 is another example of the oscillator circuit 102 illustrated in FIG. 1.

As illustrated in FIG. 3, the CMOS oscillator 300 includes some of the same circuit components as the CMOS oscillator 200. Consequently, redundant description of the same circuit components is not repeated.

When comparing the CMOS oscillator 300 to the CMOS oscillator 200, the CMOS oscillator 300 illustrates an alternative example of the current sources 228-234 and the switches 236 and 238 by replacing the current sources 228-234 with corresponding current transistors and replacing the switches 236 and 238 with corresponding switching transistors.

As illustrated in FIG. 3, the CMOS oscillator 300 includes the bias network 302 that controls the current transistors used in place of the current sources 228-234. The bias network 302 includes a bias block 304 and control transistors 306-310.

The bias block 304 outputs three distinct currents that are used to create the bias signals represented by 228-234. The currents flowing through 228-234 are scaled versions of the currents from 304.

A first current from the bias block 304 is output to the control transistor 306. The first current controls an amount of a primary current (i.e., $I_{DAC\_MIX}$) to be driven through the transistors 210-216.

A second current from the bias block 304 is output to the control transistor 308. The second current controls an amount of a first portion of an auxiliary current (i.e., $I_{CASCODE\_MIX}$) to be driven through the transistors 210-216.

A third current from the bias block 304 is output to the control transistor 310. The third current controls an amount of a second portion of the auxiliary current (i.e., $I_{BIAS\_MIX}$) to be driven through the transistors 210-216.

Figure 4:
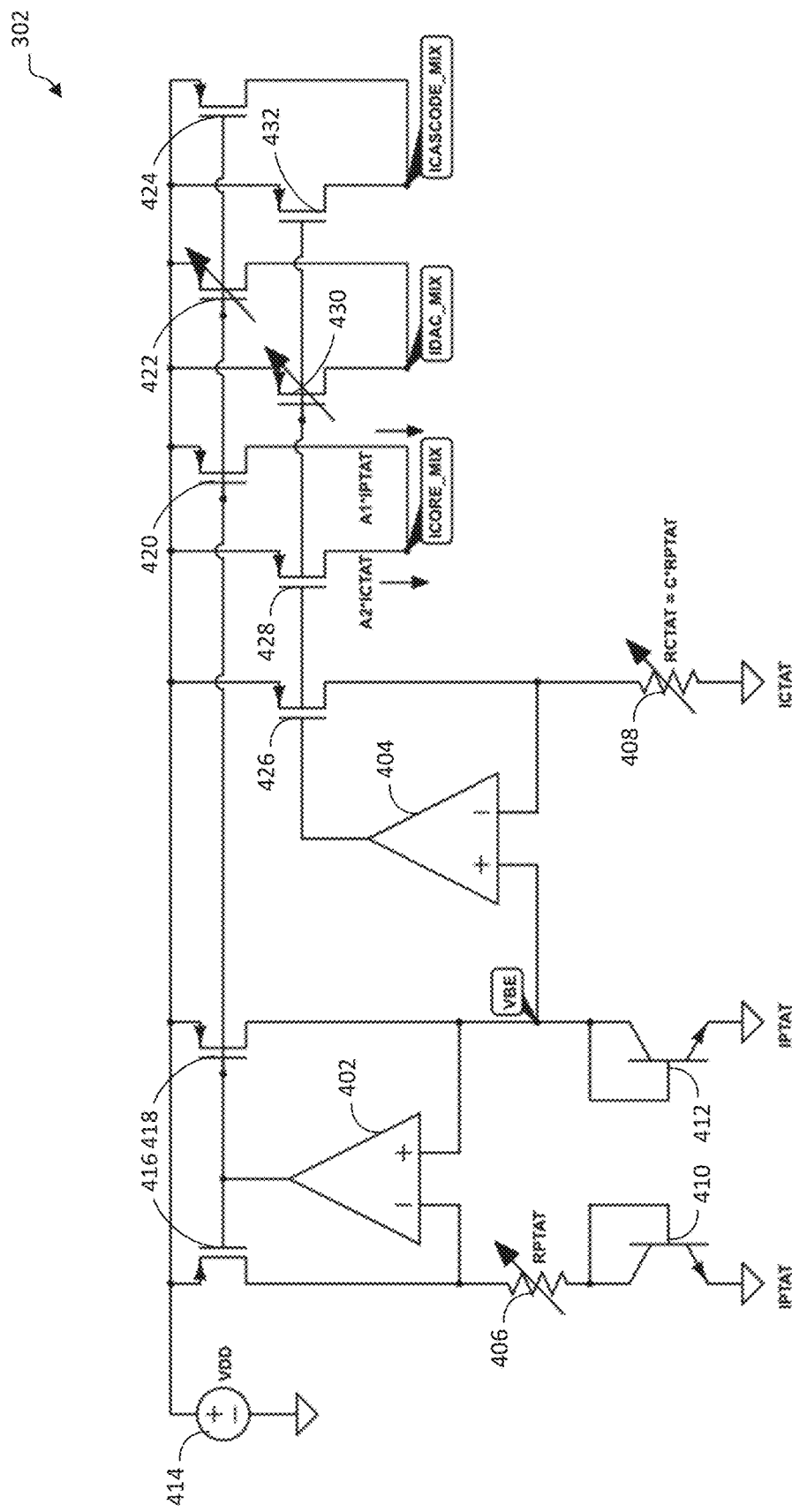
FIG. 4 is a circuit diagram illustrating an example of the bias block of FIG. 1, in accordance with various aspects of the present disclosure.

FIG. 4 is a circuit diagram illustrating an example of the bias block 302 of FIG. 1, in accordance with various aspects of the present disclosure. As illustrated in FIG. 4, the bias block 302 includes a first operational amplifier ("op-amp") 402, a second op-amp 404, a first programmable resistor 406, a second programmable resistor 408, a first bi-polar junction transistor ("BJT") 410, a second BJT 412, a voltage source 414, and a plurality of transistors 416-432.

As illustrated in FIG. 4, the first op-amp 402, the first programmable resistor 406, and the first and second BJTs 410 and 412 are generating a PTAT bias current in two current legs. The voltage VBE on the non-inverting terminal of the first op-amp 402 is provided to the inverting terminal of the second op-amp 404, which places the voltage VBE across the second programmable resistor 408. The voltage VBE is a CTAT voltage (complementary to absolute temperature) and creates a CTAT bias current when placed across the second programmable resistor 408. A CTAT signal is a signal that decreases with temperature.

The first op-amp 402 outputs a voltage that controls transistors 416-424 of the plurality of transistors 416-432 to output the PTAT bias current subject to a gain A1. The second op-amp 404 outputs a voltage that controls transistors 426-432 of the plurality of transistors 416-432 to output the CTAT bias current subject to a gain A2.

A mix of PTAT bias current and ZTAT bias current may be created from the PTAT bias current flowing through the first programmable resistor 406 and the CTAT bias current flowing through the second programmable resistor 408 in the bias block 302. The derivation of the mix of PTAT bias current and ZTAT bias current is illustrated in the following Expressions (1)-(7):

$$I_{PTAT} + I_{CTAT} = \frac{A_1 \cdot \Delta V_{BE}}{R_{PTAT}} + \frac{A_2 \cdot V_{BE}}{C \cdot R_{PTAT}} \text{ where } R_{CTAT} = \quad (1)$$
$$C \cdot R_{PTAT} \text{ and } \Delta V_{BE} \text{ is the voltage across } R_{PTAT} \text{ Let } I_{PTAT} =$$
$$\alpha \cdot I_{PTAT} + \beta \cdot I_{PTAT} \text{ and } \alpha + \beta = 1$$

$$\therefore I_{PTAT} + I_{CTAT} = I'_{PTAT} + I_{ZTAT} = \quad (2)$$
$$\frac{(1-\beta) \cdot A_1 \cdot \Delta V_{BE}}{R_{PTAT}} + \frac{\beta \cdot A_1 \cdot \Delta V_{BE}}{R_{PTAT}} + \frac{A_2 \cdot V_{BE}}{C \cdot R_{PTAT}} \text{ where } I'_{PTAT} =$$
$$\frac{(1-\beta) \cdot A_1 \cdot \Delta V_{BE}}{R_{PTAT}} \text{ and } I_{ZTAT} = \frac{\beta \cdot A_1 \cdot \Delta V_{BE}}{R_{PTAT}} + \frac{A_2 \cdot V_{BE}}{C \cdot R_{PTAT}}$$

-continued $$\text{Noting } \frac{\partial I_{ZTAT}}{\partial T} = 0, \text{ then } \beta = \frac{-A_2}{A_1 \cdot C} \cdot \frac{\partial V_{BE}/\partial T}{\partial \Delta V_{BE}/\partial T} \quad (3)$$

$$\text{Also, by definition } \beta = \frac{C \cdot I_{ZTAT} \cdot R_{PTAT} - A_2 \cdot V_{BE}}{C \cdot A_1 \cdot \Delta V_{BE}} \text{ Let } I'_{PTAT} = \quad (4)$$

$I_{ZTAT}$ at some temperature, $T_{NOM}$ $$\therefore A_1 = \frac{I_{ZTAT} \cdot R_{PTAT}}{(1-\beta) \cdot \Delta V_{BE}} \text{ where } \Delta V_{BE} \text{ is evaluated at } T_{NOM} \quad (5)$$

Set (3) = (4) and solve for C. C = (6)

$$\frac{A_2}{I_{ZTAT} \cdot R_{PTAT}} \cdot \left( V_{BE} - \frac{\Delta V_{BE} \cdot \partial V_{BE}/\partial T}{\partial \Delta V_{BE}/\partial T} \right) \approx \frac{A_2 \cdot V_{BG}}{I_{ZTAT} \cdot R_{PTAT}},$$

where $V_{BG}$ is the bandgap of silicon

Plug (6) into (3) and that result into (5) and solve for $A_1$. $A_1 =$ (7)

$$I_{ZTAT} \cdot R_{PTAT} \cdot \left( \frac{1}{\Delta V_{BE}} - \frac{\partial \Delta V_{BE}/\partial T}{V_{BG} \cdot \partial V_{BE}/\partial T} \right)$$

The above analysis shows that C and $A_1$ may be used to control the mixture of ZTAT bias current and PTAT bias current, which are created from the CTAT bias current flowing through the second programmable resistor 408 and the PTAT bias current flowing through the first programmable resistor 406. Specifically, C may be used to substantially reduce or eliminate the temperature coefficient of the ZTAT bias current and $A_1$ controls the temperature at which $I_{PTAT}'=I_{ZTAT}$. Additionally, the gain $A_2$ may be used to indirectly adjust C. Also, while FIG. 4 shows the current mirror gains, $A_1$ and $A_2$, for the $I_{CORE\_MIX}$ output, the above analysis is equally applicable to the $I_{DAC\_MIX}$ output and the $I_{CASCODE\_MIX}$ output.

As explained above, the bias block 302 outputs three outputs: an $I_{CASCODE\_MIX}$ output, an $I_{DAC\_MIX}$ output, and $I_{CORE\_MIX}$ output, and each of the three distinct current outputs includes a predetermined mix of the PTAT bias current and the ZTAT bias current. Consequently, the bias block 302 outputs three mixed bias current outputs that are used to control the transistors 218-222 and the current transistors used in place of the current sources 228-234.

The bias block 302 is also not limited to the example of outputting three distinct current outputs as illustrated in FIGS. 3 and 4. In some examples, the bias block 302 may output any three distinct outputs that indirectly controls the transistors 218-222 and the current transistors used in place of the current sources 228-234 to generate scaled versions of currents. For example, the three distinct outputs may be three distinct voltage outputs or any other suitable distinct outputs that indirectly controls the transistors 218-222 and the current transistors used in place of the current sources 228-234 to generate scaled versions of currents.

Figure 5:
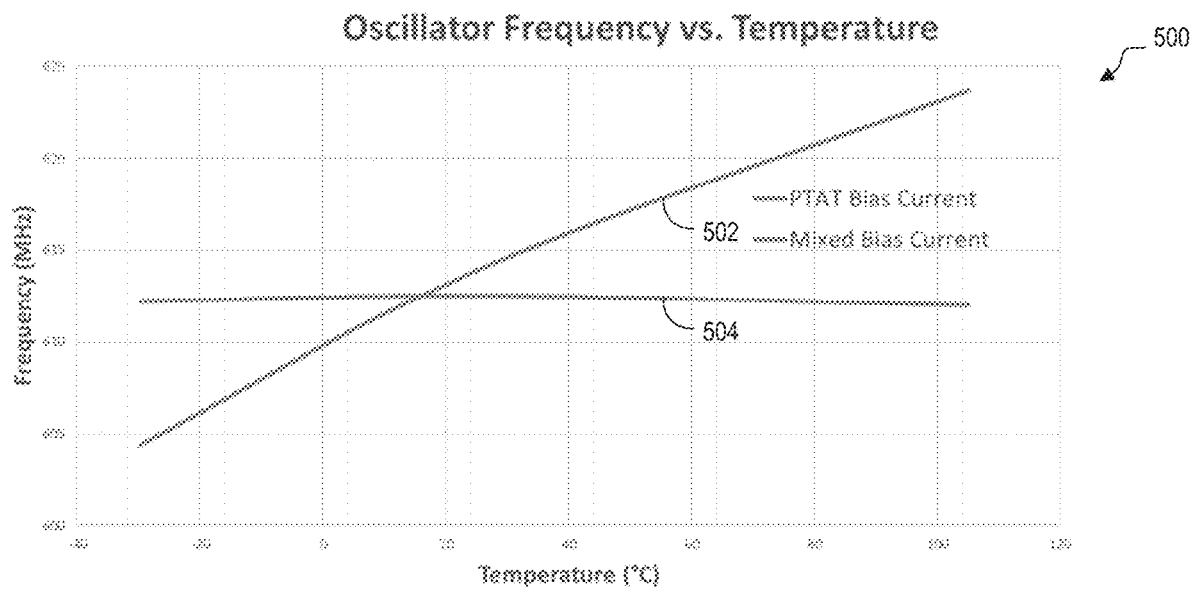
FIG. 5 is a plot illustrating oscillation frequencies over temperature of the CMOS oscillator of FIG. 2, in accordance with various aspects of the present disclosure.

FIG. 5 is a plot 500 illustrating oscillation frequencies over temperature of the CMOS oscillator 200 of FIG. 2, in accordance with various aspects of the present disclosure. In the example of FIG. 5, the plot 500 includes a PTAT bias current 502 and a mixed bias current 504.

As illustrated in FIG. 5, the PTAT bias current 502 starts at roughly 605 megahertz (MHz) and negative thirty degrees Celsius and increases to just under 625 MHz at one-hundred and five degrees Celsius in a generally linear fashion. In other words, the PTAT bias current 502 experiences an increase in frequency as temperature increases, specifically in this example, an increase of roughly 20 MHz over 135 degrees Celsius.

Similarly, as illustrated in FIG. 5, the mixed bias current 504 starts at roughly 605 megahertz (MHz) and negative thirty degrees Celsius. However, unlike the PTAT bias current 502, the mixed bias current 504 stays substantially constant over temperature, e.g., changes plus or minus one percent over temperature. In other words, unlike the PTAT bias current 502 that experiences an increase in frequency as temperature increases, the mixed bias current 504 stays roughly the same frequency over the same temperature.

Figure 6:
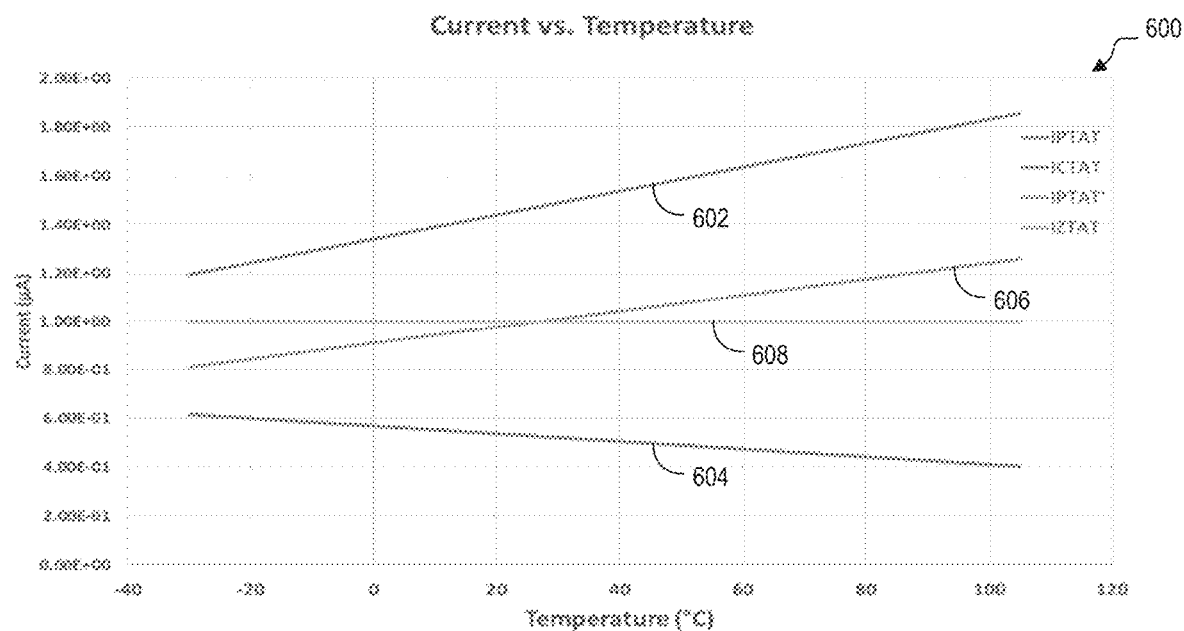
FIG. 6 is a plot illustrating bias currents over temperature of the CMOS oscillator of FIG. 2, in accordance with various aspects of the present disclosure.

FIG. 6 is a plot 600 illustrating bias currents over temperature of the CMOS oscillator 200 of FIG. 2, in accordance with various aspects of the present disclosure. In the example of FIG. 6, the plot 600 includes a first PTAT bias current 602, a CTAT bias current 604, a second PTAT bias current 606, and a ZTAT bias current 608. The CTAT bias current 604 and the ZTAT bias current 608 correspond to the CTAT bias current and the ZTAT bias current described above in FIG. 4. The first PTAT bias current 602 and the second PTAT bias current 604 correspond to the PTAT bias current and the PTAT' bias current described above in FIG. 4.

As illustrated in FIG. 6, the first PTAT bias current 602 starts at roughly 12 microamperes (µA) at negative thirty degrees Celsius and increases to just over 18 µA at one-hundred and five degrees Celsius in a generally linear fashion. In other words, the first PTAT bias current 602 experiences an increase in amperage as temperature increases, specifically in this example, an increase of roughly 6 µA over 135 degrees Celsius.

As illustrated in FIG. 6, the CTAT bias current 604 starts at roughly 6 microamperes (µA) at negative thirty degrees Celsius and decreases to 4 µA at one-hundred and five degrees Celsius in a generally linear fashion. In other words, the CTAT bias current 604 experiences a decrease in amperage as temperature increases, specifically in this example, a decrease of roughly 2 µA over 135 degrees Celsius.

As illustrated in FIG. 6, the second PTAT bias current 606 starts at roughly 8 microamperes (µA) at negative thirty degrees Celsius and increases to just over 12 µA at one-hundred and five degrees Celsius in a generally linear fashion. In other words, the second PTAT bias current 606 experiences an increase in amperage as temperature increases, specifically in this example, an increase of roughly 4 µA over 135 degrees Celsius.

Lastly, as illustrated in FIG. 6, the ZTAT bias current 608 starts at roughly 10 microamperes (µA) at negative thirty degrees Celsius and stays constant. In other words, the ZTAT bias current 608 experiences no change in amperage over the 135 degrees Celsius.

Figure 7:
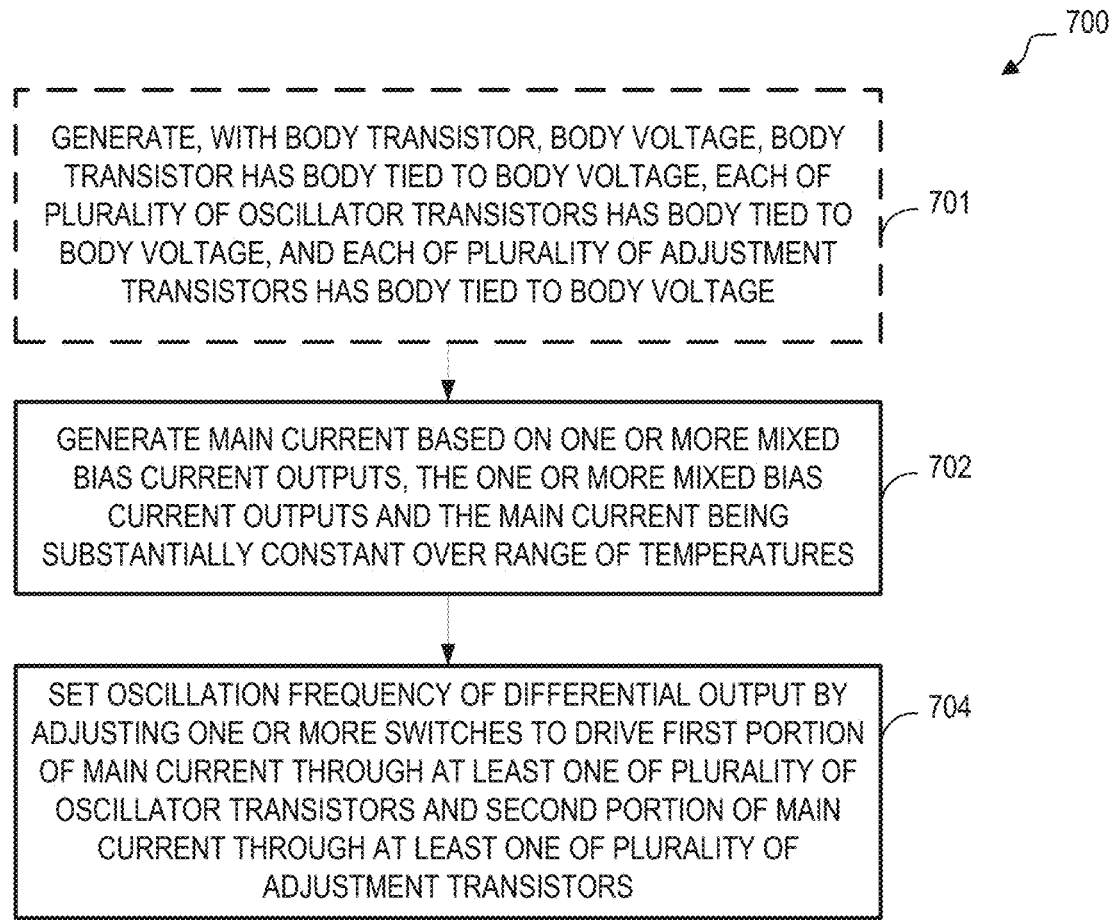
FIG. 7 is a flowchart illustrating a process for operating the CMOS oscillator of FIG. 2, in accordance with various aspects of the present disclosure.

FIG. 7 is a flowchart illustrating a process 700 for operating the CMOS oscillator of FIG. 2, in accordance with various aspects of the present disclosure. The process 700 includes generating a main current based on one or more mixed bias current outputs, the one or more mixed bias current outputs and the main current being substantially constant over a range of temperatures (at block 702).

The process 700 also includes setting an oscillation frequency of a differential output by adjusting one or more switches to drive a first portion of the main current through at least one of a plurality of oscillator transistors and a second portion of the main current through at least one of a plurality of adjustment transistors (at block 704).

In some examples, the process 700 may also include generating, with a body transistor, a body voltage (at optional block 701). The body transistor has a body tied to the body voltage. Each of the plurality of oscillator transistors has a body tied to the body voltage. Lastly, each of the plurality of adjustment transistors has a body tied to the body voltage.

Conclusion

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An oscillator circuit comprising:
a plurality of oscillator transistors comprising a plurality of gates;
a plurality of adjustment transistors coupled to the plurality of gates;
a differential output coupled to the plurality of oscillator transistors;
a plurality of current transistors configured to
receive one or more mixed bias current outputs, and
generate a main current based on the one or more mixed bias current outputs that are received, the one or more mixed bias current outputs and the main current being substantially constant over a range of temperatures; and
one or more switches configured to set an oscillation frequency of the differential output by:
driving a first portion of the main current through at least one of the plurality of oscillator transistors, and
driving a second portion of the main current through at least one of the plurality of adjustment transistors.

2. The oscillator circuit of claim 1, further comprising:
a body transistor configured to generate a body voltage,
wherein the body transistor has a body tied to the body voltage,
wherein each of the plurality of oscillator transistors has a body tied to the body voltage, and
wherein each of the plurality of adjustment transistors has a body tied to the body voltage.

3. The oscillator circuit of claim 1, further comprising:
a bias network configured to output the one or more mixed bias current outputs.

4. The oscillator circuit of claim 3, wherein the bias network includes a bias block that includes a first operational amplifier, a second operational amplifier, a first programmable resistor, a second programmable resistor, a first bi-polar junction transistor, a second bi-polar junction transistor, a voltage source, and a plurality of transistors.

5. The oscillator circuit of claim 4, wherein the first operational amplifier, the first programmable resistor, and the first and second bi-polar junction transistors are configured to generate a proportional-to-absolute temperature (PTAT) bias current in two current legs.

6. The oscillator circuit of claim 5, wherein a voltage VBE on a non-inverting terminal of the first operational amplifier is provided to an inverting terminal of the second operational amplifier and across the second programmable resistor, wherein the voltage VBE is a constant-to-absolute temperature (CTAT) voltage that creates a CTAT bias current when placed across the second programmable resistor, wherein the one or more mixed bias current outputs include a predetermined mix of zero-to-absolute (ZTAT) bias current and the PTAT bias current, and wherein the ZTAT bias current is based on the CTAT bias current and a derivation of the PTAT bias current.

7. The oscillator circuit of claim 4, wherein the first operational amplifier is configured to output a voltage that controls a first group of the plurality of transistors to output a proportional-to-absolute temperature (PTAT) bias current that is subject to a gain A1.

8. The oscillator circuit of claim 4, wherein the second operational amplifier is configured to output a voltage that controls a second group of the plurality of transistors to output a constant-to-absolute temperature (CTAT) bias current that is subject to a gain A2.

9. The oscillator circuit of claim 1, wherein the range of temperatures is from approximately −30 degrees Celsius to approximately 105 degrees Celsius.

10. An electronic device comprising:
an oscillator circuit including
a plurality of oscillator transistors comprising a plurality of gates;
a plurality of adjustment transistors coupled to the plurality of gates;
a differential output coupled to the plurality of oscillator transistors;
a plurality of current transistors configured to
receive one or more mixed bias current outputs, and
generate a main current based on the one or more mixed bias current outputs that are received, the one or more mixed bias current outputs and the main current being substantially constant over a range of temperatures; and one or more switches configured to set an oscillation frequency of the differential output by:
driving a first portion of the main current through at least one of the plurality of oscillator transistors, and
driving a second portion of the main current through at least one of the plurality of adjustment transistors.

11. The electronic device of claim 10, further comprising:
a body transistor configured to generate a body voltage,
wherein the body transistor has a body tied to the body voltage,
wherein each of the plurality of oscillator transistors has a body tied to the body voltage, and
wherein each of the plurality of adjustment transistors has a body tied to the body voltage.

12. The electronic device of claim 10, further comprising:
a bias network configured to output the one or more mixed bias current outputs.

13. The electronic device of claim 12, wherein the bias network includes a bias block that includes a first operational amplifier, a second operational amplifier, a first programmable resistor, a second programmable resistor, a first bi-polar junction transistor, a second bi-polar junction transistor, a voltage source, and a plurality of transistors.

14. The electronic device of claim 13, wherein the first operational amplifier, the first programmable resistor, and the first and second bi-polar junction transistors are configured to generate a proportional-to-absolute temperature (PTAT) current in two current legs.

15. The electronic device of claim 14, wherein a voltage VBE on a non-inverting terminal of the first operational amplifier is provided to an inverting terminal of the second operational amplifier and across the second programmable resistor, wherein the voltage VBE is a constant-to-absolute temperature (CTAT) voltage that creates a CTAT bias current when placed across the second programmable resistor, wherein the one or more mixed bias current outputs include a predetermined mix of zero-to-absolute (ZTAT) bias current and the PTAT bias current, and wherein the ZTAT bias current is based on the CTAT bias current and a derivation of the PTAT bias current.

16. The electronic device of claim 13, wherein the first operational amplifier is configured to output a voltage that controls a first group of the plurality of transistors to output a proportional-to-absolute temperature (PTAT) bias current that is subject to a gain A1.

17. The electronic device of claim 13, wherein the second operational amplifier is configured to output a voltage that controls a second group of the plurality of transistors to output a constant-to-absolute temperature (CTAT) bias current that is subject to a gain A2.

18. The electronic device of claim 10, wherein the range of temperatures is from approximately −30 degrees Celsius to approximately 105 degrees Celsius.

19. A method for operating an oscillator circuit, comprising:
generating a main current based on one or more mixed bias current outputs, the one or more mixed bias current outputs and the main current being substantially constant over a range of temperatures; and
setting an oscillation frequency of a differential output by adjusting one or more switches to drive a first portion of the main current through at least one of a plurality of oscillator transistors and a second portion of the main current through at least one of a plurality of adjustment transistors.

20. The method of claim 19, further comprising:
generating, with a body transistor, a body voltage,
wherein the body transistor has a body tied to the body voltage,
wherein each of the plurality of oscillator transistors has a body tied to the body voltage, and
wherein each of the plurality of adjustment transistors has a body tied to the body voltage.

* * * * *